(12) United States Patent
Carinci et al.

(10) Patent No.: US 10,330,759 B2
(45) Date of Patent: Jun. 25, 2019

(54) METHOD AND APPARATUS FOR IMPLEMENTING A TURBO SPIN ECHO-BASED REFERENCE SCAN FOR SIMULTANEOUS MULTISLICE MAGNETIC RESONANCE DATA ACQUISITIONS

(71) Applicant: Siemens Healthcare GmbH, Erlangen (DE)

(72) Inventors: Flavio Carinci, Erlangen (DE); Dominik Paul, Bubenreuth (DE); Himanshu Bhat, Newton, MA (US); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 207 days.

(21) Appl. No.: 15/262,233

(22) Filed: Sep. 12, 2016

(65) Prior Publication Data

US 2018/0074147 A1 Mar. 15, 2018

(51) Int. Cl.
*G01V 3/00* (2006.01)
*G01R 33/483* (2006.01)
*G01R 33/561* (2006.01)
*G01R 33/385* (2006.01)

(52) U.S. Cl.
CPC ..... *G01R 33/4835* (2013.01); *G01R 33/3852* (2013.01); *G01R 33/5617* (2013.01)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838; G01R 33/387; G01R 33/246; G01R 33/38
USPC .................................................. 324/300–322
See application file for complete search history.

(56) References Cited

U.S. PATENT DOCUMENTS

| | | | |
|---|---|---|---|
| 2016/0033603 A1* | 2/2016 | Paul ................... | G01R 33/4818 324/309 |
| 2017/0108567 A1* | 4/2017 | Bhat ................... | G01R 33/5602 |
| 2017/0315202 A1* | 11/2017 | Bhat ................... | G01R 33/5617 |
| 2018/0031659 A1* | 2/2018 | Bhat ................... | G01R 33/5602 |

OTHER PUBLICATIONS

Barth et al., "Simultaneous multislice (SMS) imaging techniques", Aug. 26, 2015, Magnetic Resonance in Medicine, vol. 75, Issue 1, pp. 63-81.*

(Continued)

*Primary Examiner* — Giovanni Astacio-Oquendo
*Assistant Examiner* — Raul J Rios Russo
(74) *Attorney, Agent, or Firm* — Schiff Hardin LLP

(57) ABSTRACT

In a method and apparatus for acquiring magnetic resonance (MR) data, an MR data acquisition scanner is operated, while a subject is situated therein to execute a simultaneous multislice (SMS) turbo spin echo (TSE) sequence by implementing a TSE-based reference scan to acquire reference data and an imaging scan, to acquire raw MR data from the subject. The reference data and the raw MR data are entered into a memory organized as k-space. A computer accesses the memory in order to make the k-space data, composed of said reference data and said image data, available in electronic form, as at least one data file.

16 Claims, 8 Drawing Sheets

(56) References Cited

OTHER PUBLICATIONS

Setsompop et al. "Improving Diffusion MRI Using Simultaneous Multi-Slice Echo Planar Imaging," NeuroImage, vol. 63, pp. 569-580 (2012).
Breuer et al. "Controlled Aliasing in Parallel Imaging Results in Higher Acceleration (CAIPIRINHA) for Multi-Slice Imaging," Magnetic Resonance in Medicine, vol. 53, pp. 684-691 (2005).
Larkman et al. "Use of Multicoil Arrays for Separation of Signal from Multiple Slices Simultaneously Excited," Journal of Magnetic Resonance Imaging, vol. 13, pp. 313-317 (2001).
Souza et al., "SIMA: Simultaneous Multislice Acquisition of MR Images by Hadmard-Encoded Excitation," Journal of Computer Assisted Tomography, vol. 12(6), pp. 1026-1033 (1988).
Setsompop et al. "Blipped-Controlled Aliasing in Parallel Imaging for Simultaneous Multislice Echo Planar Imaging with Reduced g-factor Penalty," Magnetic Resonance in Medicine, vol. 67, pp. 1210-1224 (2012).
Cauley et al., "Interslice Leakage Artifact Reduction Technique for Simultaneous Multislice Acquisitions," Magnetic Resonance in Medicine, vol. 72, pp. 93-102 (2014).

\* cited by examiner with RARE reference scan with GRE reference scan

METHOD AND APPARATUS FOR IMPLEMENTING A TURBO SPIN ECHO-BASED REFERENCE SCAN FOR SIMULTANEOUS MULTISLICE MAGNETIC RESONANCE DATA ACQUISITIONS

BACKGROUND OF THE INVENTION

Field of the Invention

The present invention concerns a method and an apparatus for implementing a simultaneous multislice (SMS) magnetic resonance (MR) data acquisition, and in particular to an SMS data acquisition protocol making use of a turbo spin echo-based (TSE-based) reference scan.

Description of the Prior Art

MR imaging is a widely used imaging modality for medical diagnosis as well as for material inspection.

In a magnetic resonance apparatus, the examination object (a patient, in the case of medical magnetic resonance imaging) is exposed to a strong and constant basic magnetic field (called the $B_0$ field), by the operation of a basic field magnet of an MR scanner, in which the examination object is situated. The MR scanner also has a gradient coil arrangement that is operated in order to activate gradient fields that spatially encode the magnetic resonance signals. The magnetic resonance signals are produced by the radiation of radio-frequency (RF) pulses from an RF radiator, such as one or more antennas, in the MR scanner. These RF pulses excite nuclear spins in the examination object, and are therefore often called excitation pulses. The excitation of the nuclear spins at an appropriate frequency causes the nuclear spins to deviate, by an amount called the flip angle, from the alignment of the nuclear spins that was produced by the basic magnetic field. As the nuclear spins relax, while returning to alignment in the basic magnetic field, they emit MR signals (which are also RF signals), which are received by suitable RF reception antennas in the MR scanner, which may be the same or different from the RF radiator used to emit the excitation pulse.

The acquired MR signals are digitized and entered into an electronic memory, organized as k-space, as k-space data. The k-space data are also referred to as raw MR data. The k-space memory has a number of individual locations that are available for entering the digitized signal thereat (data entry points), and the path of data entry points along which the digitized data are entered is called the k-space trajectory. The acquired data can be entered into k-space linearly (line-by-line of data entry points) or radially, along a straight or curved path proceeding from the center of k-space toward the periphery of k-space.

Many reconstruction algorithms are known for operating on the k-space data to convert the k-space data into image data representing an image of the volume of the examination object from which the raw MR data were acquired. This reconstruction algorithm is executed in an image reconstruction computer, resulting in an image data file from the computer that can be shown at the display screen of a monitor, or archived for storage.

After the nuclear spins have been flipped by the RF excitation pulse, the resulting MR signal exhibits an exponential decay in strength as the excited nuclear spins relax. This decaying signal is referred to as an echo signal, or simply as an echo. A commonly used data acquisition sequence of appropriately timed RF excitations and gradient pulse activations (switchings) is the echo planar imaging (EPI) sequence. In an EPI sequence, instead of measuring only one echo after each excitation pulse, multiple echoes are detected by multiple activations of the readout gradient after a single excitation pulse. In an EPI sequence, therefore, the total echo time of the decaying MR signal that follows the excitation of the nuclear spins is divided into a number of individual echo times, corresponding to the number of activated readout gradients.

The turbo spin echo (TSE) sequence is the "clinical workhorse" sequence for MR imaging, by virtue of being the most utilized sequence for all types of body region imaging. A TSE sequence has several echo trains, and in each echo train, multiple phase encoding lines of the entirety of k-space are scanned (filled with data) after one excitation pulse. This is achieved by refocusing the spins after each readout line, utilizing refocusing RF pulses. Compared to a conventional spin echo (SE) sequence, the acquisition time in a TSE sequence is reduced by the number of refocused echoes in one echo train. This reduction is known as the turbo factor. A TSE sequence diagram showing one echo is depicted in FIG. 1.

A technique for accelerating MR data acquisition, and thereby reducing the time that the patient must spend within the MR scanner, is the simultaneous multi-slice (SMS) technique. Details of techniques for SMS data acquisition can be found in Setsompop et al. "Improving Diffusion MRI Using Simultaneous Multi-Slice Echo Planar Imaging," NeuroImage, Vol., 63, pages 569-580 (2012) and Breuer et al. "Controlled Aliasing in Parallel Imaging Results in Higher Acceleration (CAIPIRINHA) For Multi-Slice Imaging," Magnetic Resonance in Medicine, Vol. 53, pp 584-591 (2005) and Larkman et al. "Use of Multi-Coil Arrays for Separation of Signal from Multiple Slices Simultaneously Excited," Journal of Magnetic Resonance Imaging, Vol. 13, pp 313-317 (2001) and Souza et al., "SIMA: Simultaneous Multislice Acquisition of MR Images by Hadmard-Encoded Excitation," Journal of Computer Assisted Tomography, Vol. 12(6), pp 1026-1033 (1988).

In general, the SMS technique involves the simultaneous excitation of a number of slices of a volume that is to be imaged, and the simultaneous acquisition of the resulting MR signals from the multiple slices. The number of slices that are simultaneously excited are typically grouped in a slice group. The SMS technique is typically characterized by an acceleration factor that indicates how many slices are simultaneously excited in a slice group by one individual radio-frequency pulse. The acceleration factor is at least two.

Since the k-space data for all of the simultaneously acquired slices are entered simultaneously into k-space, the subsequent reconstruction of the respective images of the individual slices involves a separation of the k-space data for the multiple slices. The data for the respective slices can be separated using a known slice separation method, such as the slice GRAPPA (Generalized Autocalibration Partially Parallel Acquisitions) technique, noted in the aforementioned article by Setsompop et al. This enables the SMS technique to be used to acquire a number of slices at the same time. A schematic illustration of this known technique is shown in FIG. 2, for the example of three slices S1, S2 and S3.

As noted above, in SMS imaging, multiple slices are excited at the same time. In the example of FIG. 2, this takes place using blipped CAIPIRINHA (Controlled Aliasing in Parallel Imaging Results in Higher Acceleration), and is described in the article by Setsompop et al. "Blipped-Controlled Aliasing in Parallel Imaging for Simultaneous Multi-Slice Echo Planar Imaging with Reduced g-factor Penalty," Magnetic Resonance in Medicine, Vol. 67(5), pp. 1210-1224 (2012) (shortened to blipped CAIPI therein).

In SMS imaging, in order to excite multiple slices simultaneously, a multi-band (MB) excitation pulse is used. For each slice in which the nuclear spins are to be excited, a linear phase ramp is added to a standard excitation pulse. The linear phase results in a slice shift in the spatial domain. The pulse shapes for all bands are added (superimposed), resulting in a baseband-modulated MB pulse.

The individual signals that are superimposed as a result of the MB pulse are received from respective individual coils of the MR data acquisition scanner. These coils necessarily respectively occupy different spatial positions, but are in close enough proximity to each other so that the same nuclear spins will be detected by more than one of the multiple coils. Because each coil is situated at a different position in space, however, the effect of each individual coil on the reception of a given individual nuclear spin will be slightly different, and must be taken into account. This is done by calculating a so-called g-factor (geometry factor) for the coil array that is used. The extent to which the g-factor degrades the resulting reconstructed image is called the g-factor penalty. In order to reduce the g-factor penalty in SMS imaging, interslice image shifts are deliberately induced during the readout in blipped CAIPI, either by gradient blips on the slice axis or by modulating the phase of the RF pulses. After the data have been acquired, the simultaneously excited slices are collapsed into a single slice for entry of the data into k-space. The individual slices can be separated in the post-processing, utilizing the aforementioned slice GRAPPA technique, as schematically illustrated in FIG. 2.

It is known to combine SMS and TSE techniques. In order to allow for the unfolding of the collapsed multi-band data that occurs in such a combination, a single-band reference scan, which covers all slices from which data are to be acquired, must be used to acquire reference data, in addition to acquiring the multi-band data. The current SMS TSE implementation uses a gradient echo (GRE) reference scan preceding the SMS data acquisition. Although this scan is very fast, it has been found to be prone to slice crosstalk and fat ring ghosting artifacts, which limit its application in routine clinical practice. A suspected cause of these drawbacks is the presence of inconsistencies between the GRE reference scan and the TSE imaging scan. Such inconsistencies might arise due to the presence of $B_0$ inhomogeneities, different fat-water shift behavior, and/or different slice profiles.

SUMMARY OF THE INVENTION

An object of the present invention is to overcome the aforementioned drawbacks that occur with the conventional use of a GRE sequence for implementing the reference scan, in combined SMS TSE acquisition of MR data.

This object is achieved in accordance with the present invention in a method and apparatus for implementing an SMS TSE MR data acquisition scan, wherein a TSE-based reference scan is implemented, instead of the conventional GRE reference scan.

The TSE-based reference scan can be, for example, a RARE (Rapid Acquisition with Relaxation Enhancement) sequence, or a HASTE (Half-Fourier Acquisition Single-Shot Turbo Spin Echo) sequence.

In an embodiment the TSE-based reference scan can simply replace the GRE reference scan, preceding the imaging scan.

In another embodiment, the TSE-based reference scan is implemented to acquire reference data after the image data acquisition.

DESCRIPTION OF THE PREFERRED EMBODIMENTS

Figure 8:
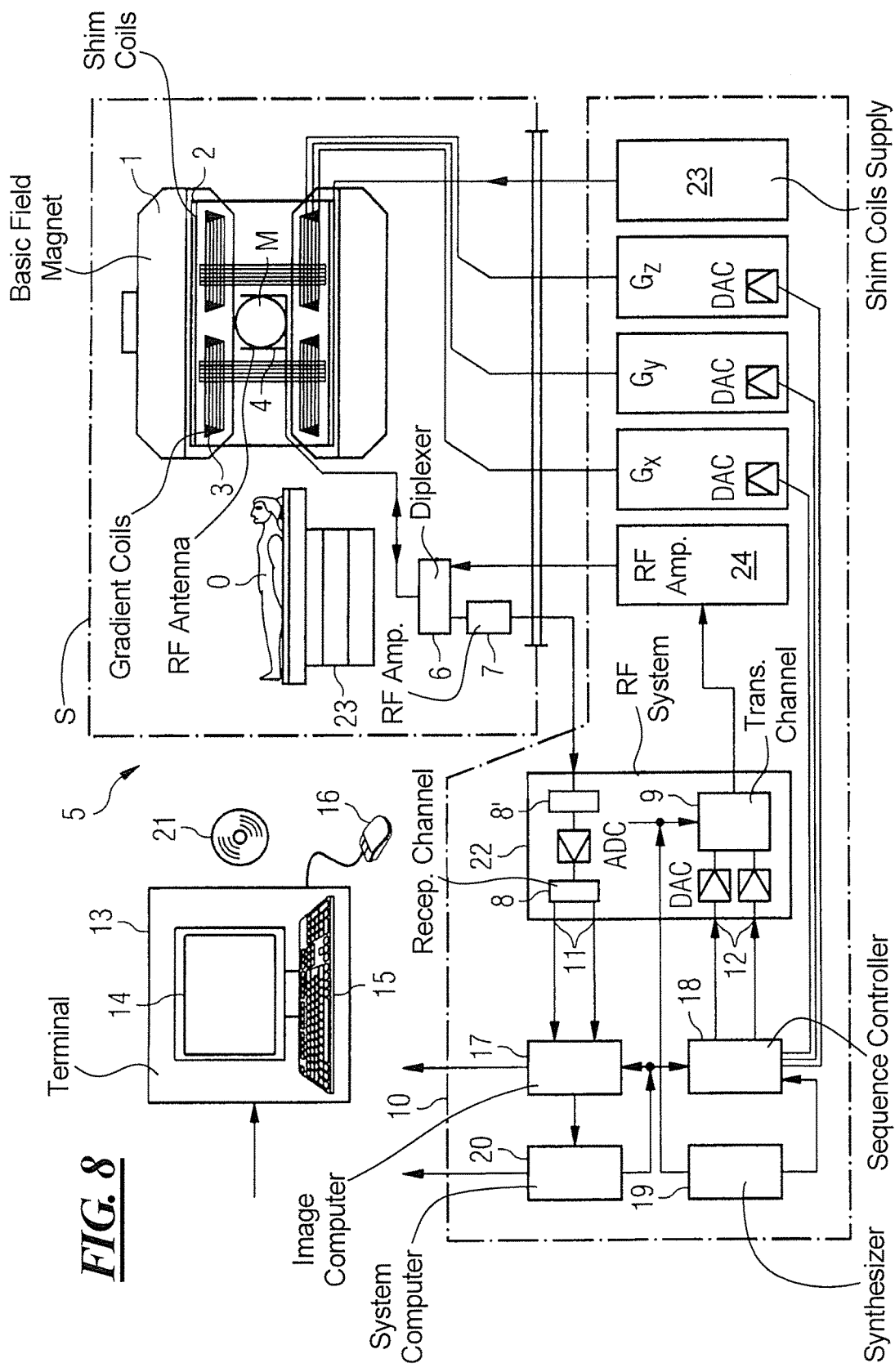
FIG. 8 is a block diagram illustrating a magnetic resonance apparatus constructed and operating in accordance with the invention.

FIG. 8 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 23 for the shim-coils 2.

A cylindrically shaped gradient coil system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

Figure 1:
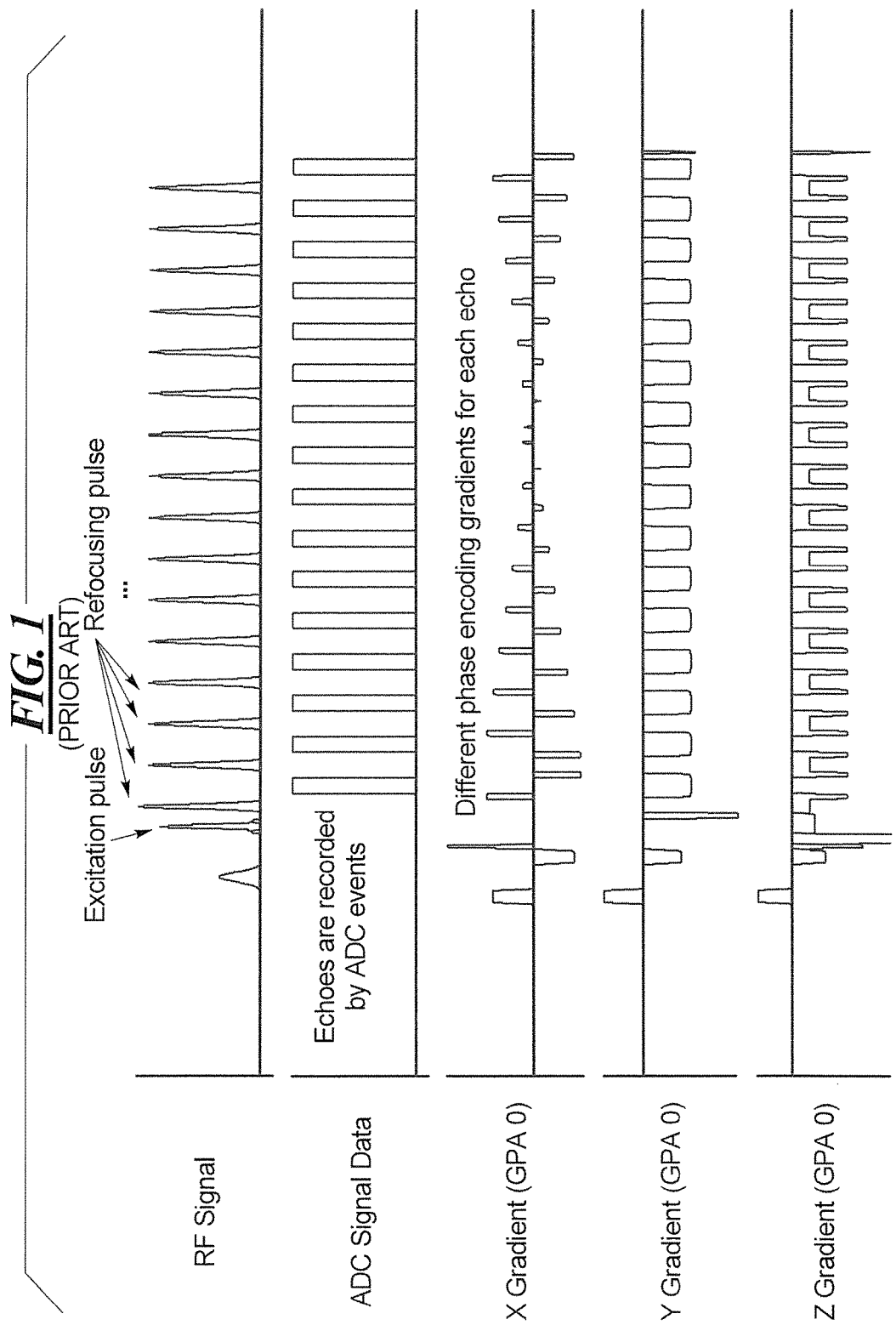
FIG. 1, as noted above, schematically illustrates a conventional TSE sequence for the acquisition of MR raw data, to be converted into MR image data.
Figure 2:
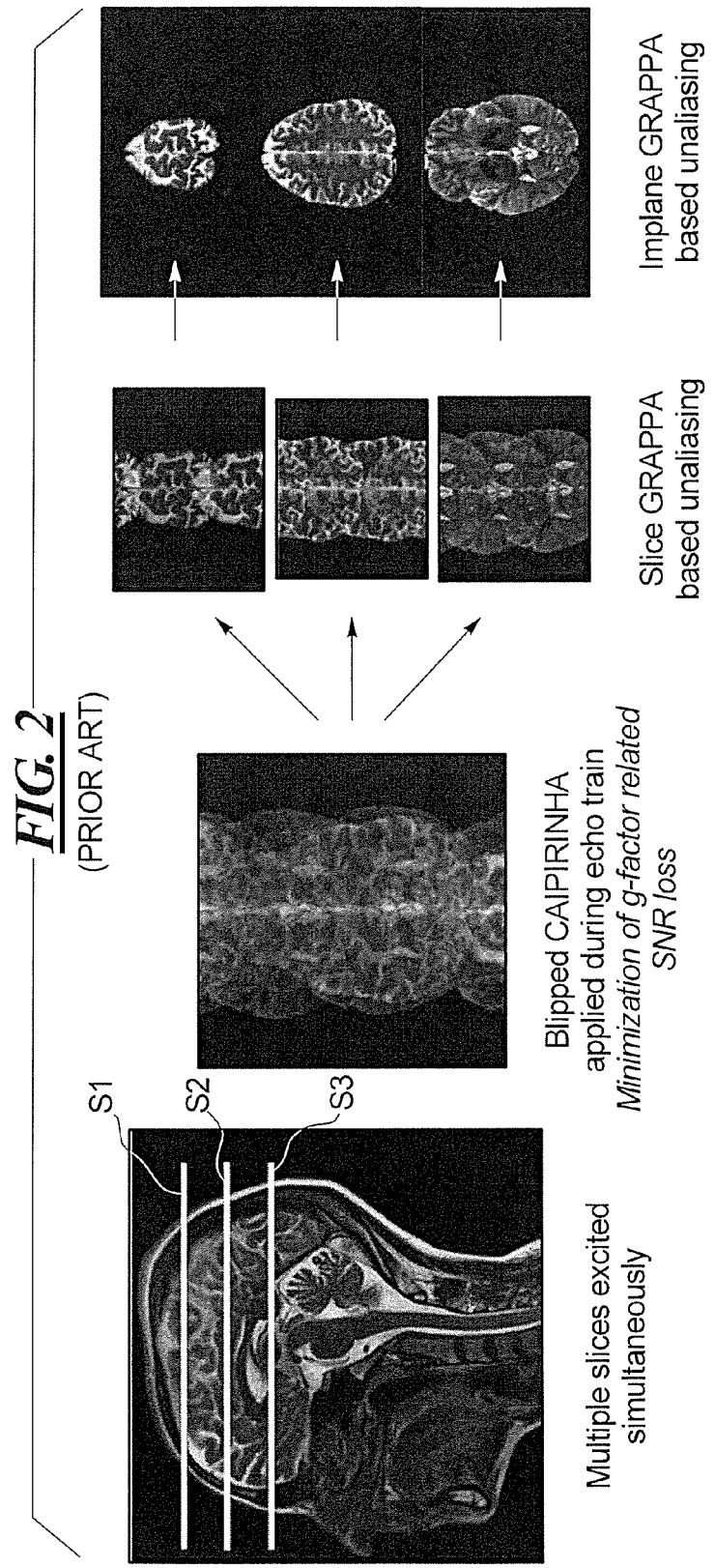
FIG. 2, as noted above, schematically illustrates a conventional SMS acceleration technique.
Figure 3:
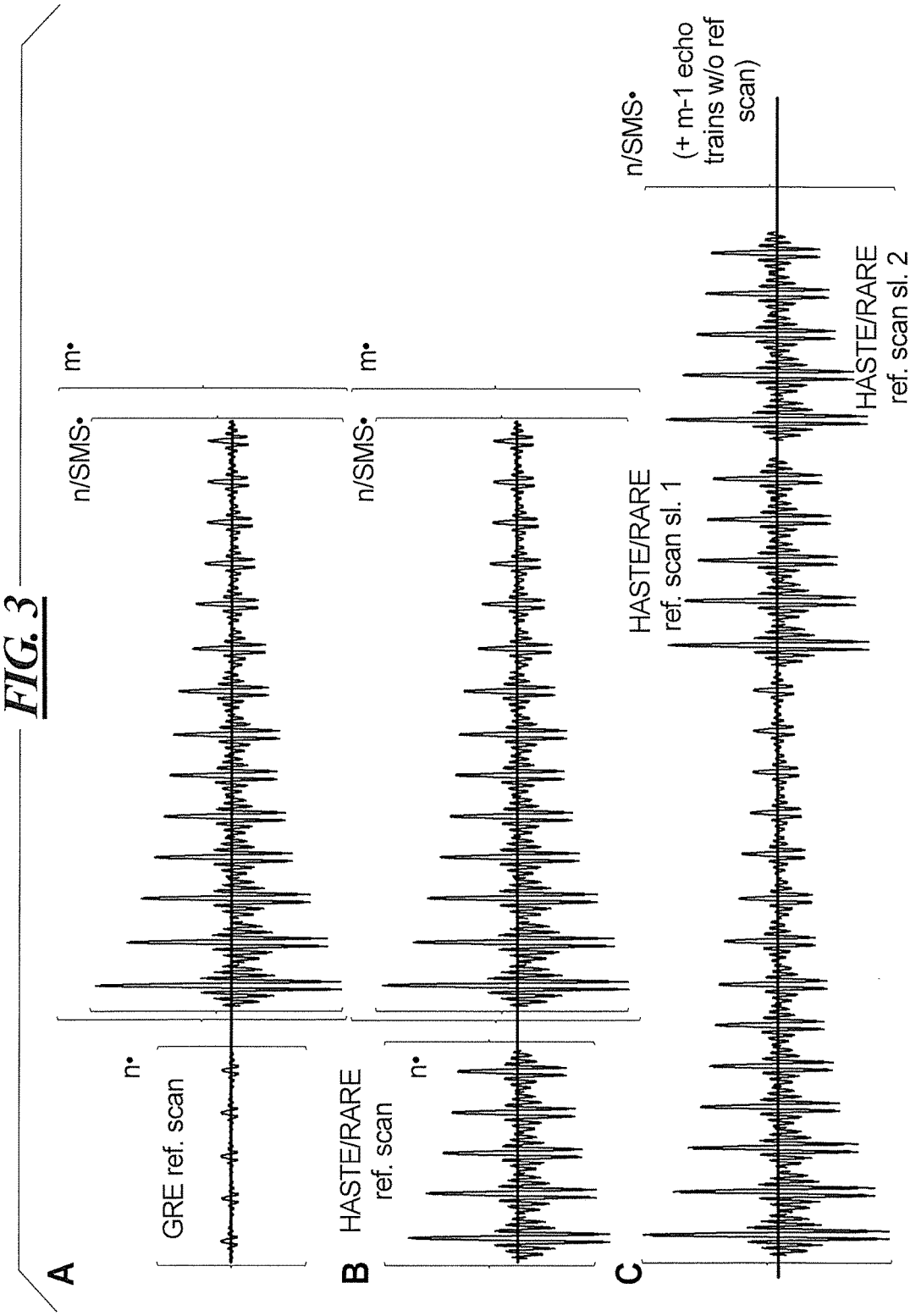
FIG. 3, in sequence A, illustrates an SMS echo train preceded a conventional GRE reference scan, and in sequence B shows the SMS echo train preceded by a HASTE or RARE reference scan in accordance with the invention, and in sequence C shows an SMS echo train followed by a HASTE or RARE reference scan for slice 1 and a HASTE or RARE reference scan for slice 2, in accordance with the invention.

FIG. 3 shows a comparison between the use of the conventional GRE reference scan and two embodiments in accordance with the invention. The GRE reference scan in sequence A shown in FIG. 3 is acquired for all slices n prior to the actual multi-band data acquisition (raw magnetic resonance data acquisition). The multi-band data acquisition is repeated in two loops (executions). The first loop is repeated m times, with m equaling the number of echo trains (the number of acquired PE lines is equal to the product of the turbo factor and m). The inner loop is repeated n/SMS times, with SMS being the multi-band or SMS factor.

The first TSE variant in accordance with the invention (sequence B) is similar to the conventional GRE sequence, but the GRE reference data acquisition prior to the imaging scan is replaced by a TSE-based acquisition scan, such as HASTE scan or a RARE scan. As in sequence A, this TSE-based reference scan precedes the imaging scan.

A further embodiment in accordance with the invention is shown in sequence C, wherein reference data are acquired after the image data acquisition. The echo train that is acquired with multi-band pulses is followed by several single-band TSE-based reference echo trains (such as HASTE or RARE echo trains that target the slices from which raw data were acquired in the multi-band imaging scan. In the example shown in FIG. 3, an SMS factor of 2 was used, and therefore two reference scans respectively targeting those two slices are implemented. In the embodiment of sequence C, reference data are acquired only after one multi-band echo train for each slice, preferably the last echo train in the imaging acquisition. The other m+1 multi-band reference scans are implemented in conventional fashion, i.e., without the reference scan. This embodiment can be used in order to reduce the total acquisition time in situations where the minimum TR for each echo train cannot be used, due to a long tissue relaxation (for example, for T2-weighted brain imaging). The dead time is then used for the reference data acquisition, and no separate reference scan, which requires additional time, is needed.

Embodiments B and C in FIG. 3 use single-shot RARE or HASTE reference scans, but the reference scans may also be acquired in segmented TSE-based fashion. A variant for sequence C shown in FIG. 3 would then be to acquire a small number of reference lines after each of the m multi-band echo trains.

It should also be noted that the scan parameters (such as line recording, pulse properties, flip angles, readout bandwidth, TE, TR) of the reference scan and the imaging scan do not necessarily have to match, but can be chosen independently of each other.

Comparisons of data acquired with a conventional GRE reference scan and the inventive TSE-based reference scan (embodiment B of FIG. 3) with different numbers of references lines are shown in FIGS. 4 through 7. These figures demonstrate the superior image quality obtained with the use of the TSE-based reference scan in accordance with the invention.

Figure 4:
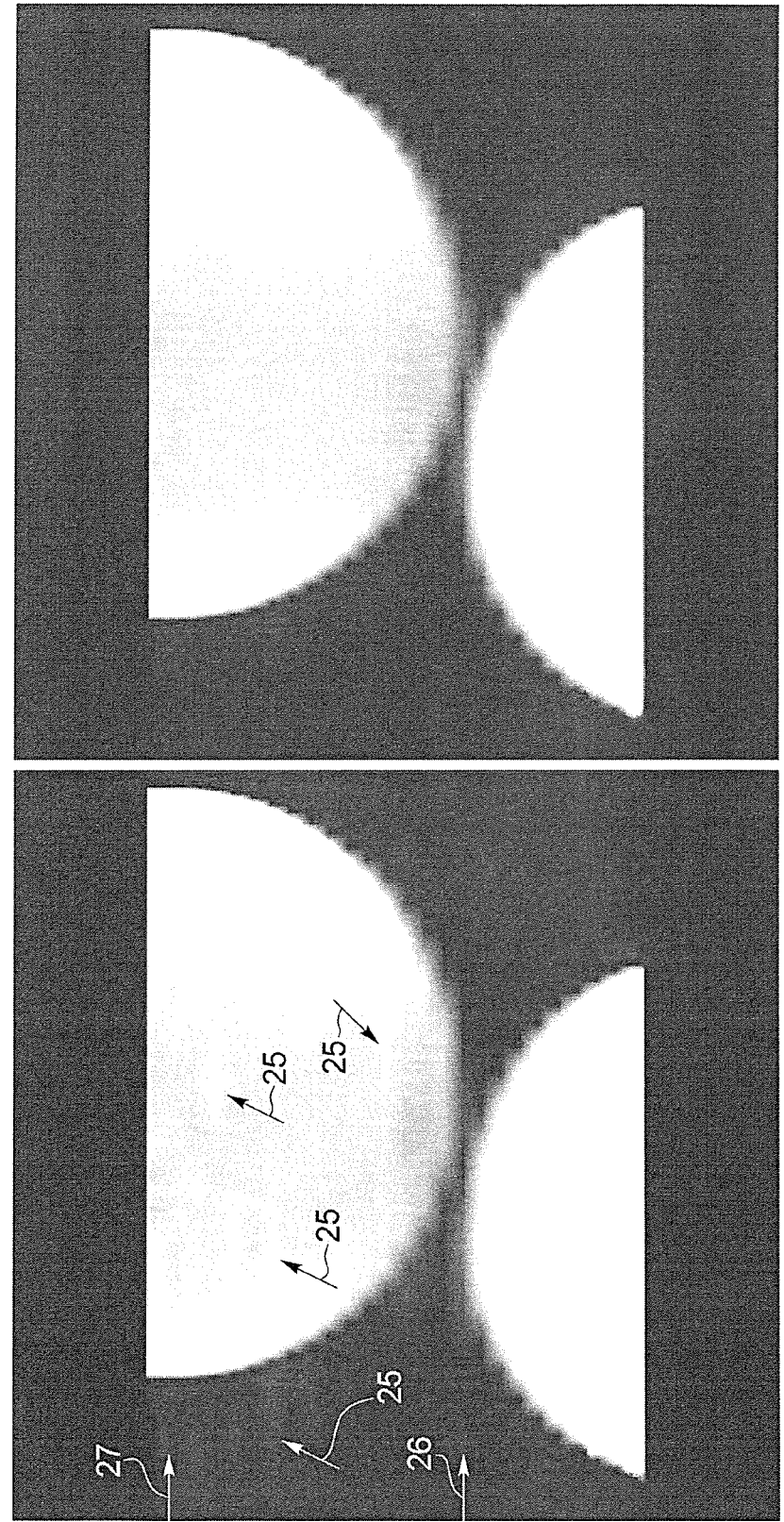
FIG. 4 shows, at the left, an image of a fat phantom and a standard phantom acquired with a conventional GRE reference scan and at the right an image of the same phantoms acquired with a RARE reference scan in accordance with the invention.
Figure 5:
FIG. 5 shows images of the slice designated by arrow 26 in FIG. 4 with the image at the upper left being acquired with the conventional GRE reference scan and the other images being acquired in accordance with the invention with data acquisitions using a RARE reference scan with different numbers of k-space lines being acquired, respectively.
Figure 6:
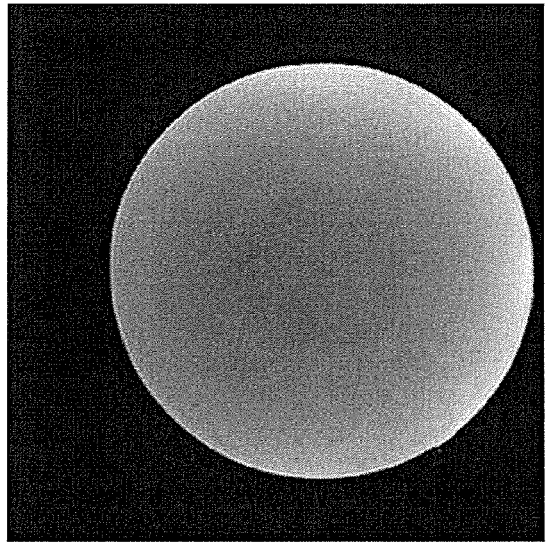
FIG. 6 shows images of the slice designated by arrow 27 in FIG. 4, with the image at the upper left being acquired with a conventional GRE reference scan, and the other images being acquired in accordance with the invention in acquisitions with a RARE reference scan wherein different numbers of k-space lines are acquired, respectively.
Figure 6:
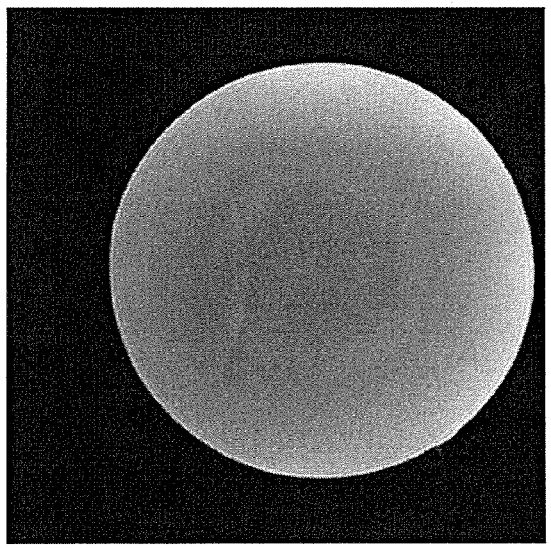

FIGS. 4, 5 and 6 show images obtained using a fat phantom and a standard phantom placed next to each other. FIG. 4 shows the sagittal reconstruction of an SMS TSE scan composed of 26 slices with an SMS factor of 2. The reconstruction with the RARE reference scan is shown at the right, with the image obtained using the conventional GRE reference scan being shown at the left. Image artifacts that are present in the conventional scan are indicated by arrows 25, and it can be seen that a much more homogenous image intensity, with no artifacts outside the phantom is achieved in accordance with the invention.

FIG. 5 shows the same phantoms as in FIG. 4, in the slice designated by arrow 26 in FIG. 4 The conventional GRE reference scan is shown at the upper left, and images obtained in accordance with the invention using a RARE reference scan are shown on the right. The RARE reference scan shows less slice crosstalk artifacts than the reconstruction using the conventional GRE reference scan.

FIG. 6 shows reconstructed images of the slice designated by the arrow 27 in FIG. 4, using the conventional GRE reference scan and for an image acquisition in accordance with the invention using a RARE reference scan. Again it can be seen in FIG. 6 that in the RARE reference scan reconstruction, less slice crosstalk artifacts are present than in the reconstruction using the conventional GRE reference scan.

Figure 7:
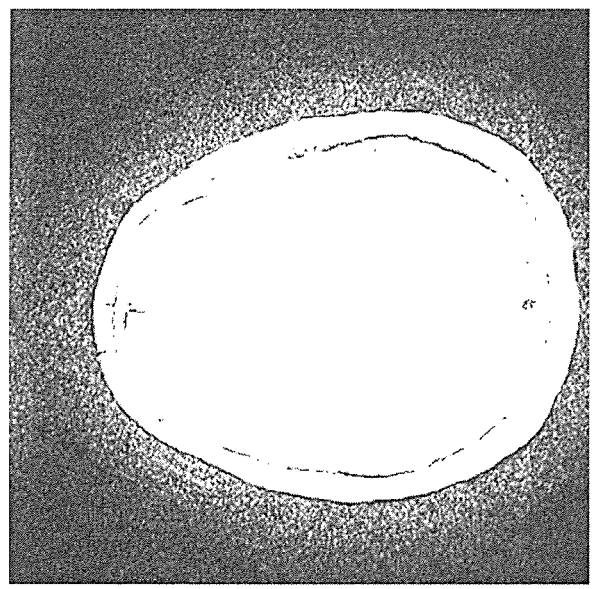
FIG. 7 shows images of an SMS volunteer scan, with the upper left image being acquired with a conventional GRE reference scan, and the other images being acquired in accordance with the invention with acquisitions having a RARE reference scan, wherein different numbers of lines in k-space are acquired, respectively.
Figure 7:
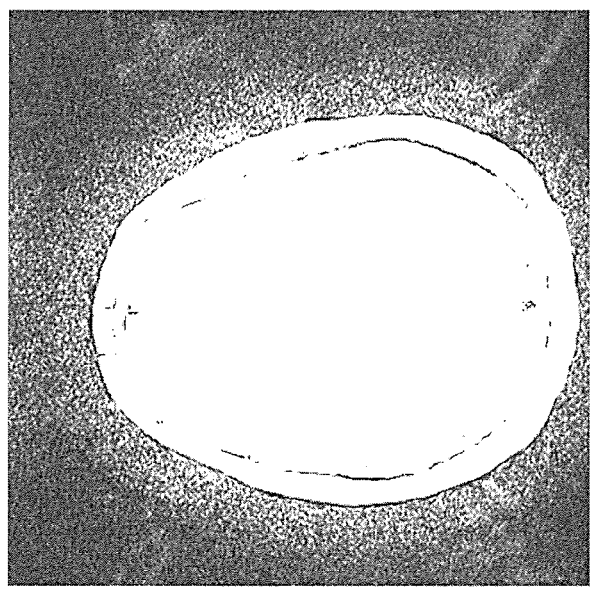

FIG. 7 shows SMS scans obtained from a volunteer subject and windowed to artifact level. Again the left image is obtained with the conventional GRE reference scan, and the right image was obtained using a RARE reference scan. The slice crosstalk and ghosting that can be seen in the image acquired with the GRE reference scan are not visible in the images acquired using the RARE reference scan in accordance with the invention.

In the discussion above, the combination of a TSE-based reference scan and multi-band TSE imaging scan has been used as an example. It is expected that TSE-based reference scan can be beneficial to use with other SMS imaging techniques, such as SMS EPI for abdominal imaging with a large field of view.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating magnetic resonance (MR) images, comprising:
   in a control computer, generating control signals for execution of a simultaneous multi-slice (SMS) turbo spin echo (TSE) sequence in an MR data acquisition scanner that comprises control signals both for acquiring reference data and for acquiring raw MR data from a subject in a same SMS TSE scan;
   providing said control signals from said computer to said MR data acquisition scanner and thereby operating said MR data acquisition scanner so as to execute said SMS TSE sequence in order to acquire said MR data simultaneously from multiple slices in said subject in an imaging scan of said SMS TSE scan, and to enter said raw MR data as k-space data into a memory organized as k-space, said k-space data requiring said reference data in order to separate said k-space data into individual data sets respectively for said multiple slices;
   with said control signals, also operating said MR data according to said SMS TSE sequence so as to acquire said reference data in a TSE-based reference scan of said SMS TSE scan;
   in a reconstruction computer, separating the k-space data into said individual data sets for the respective multiple slices using said reference data, and reconstructing a respective image of each of said multiple slices from the respective separated individual data sets; and
   making the respective data sets for the respective multiple slices available from the reconstruction computer in electronic form.

2. A method as claimed in claim 1 comprising implementing said TSE-based reference scan before said imaging scan in said SMS TSE scan.

3. A method as claimed in claim 1 comprising implementing said TSE-based reference scan after said imaging scan in said SMS TSE scan.

4. A method as claimed in claim 3 wherein said imaging scan comprises a multi-band echo train for each SMS slice, and implementing said reference scan after only one of said multi-band echo trains for the respective SMS slices.

5. A method as claimed in claim 4 comprising implementing said TSE-based reference scan after a last echo train in said imaging scan.

6. A method as claimed in claim 1 comprising implementing said TSE-based reference scan as a RARE (Rapid Acquisition with Relaxation Enhancement) sequence.

7. A method as claimed in claim 1 comprising implementing said TSE-based reference scan as a HASTE (Half-Fourier Acquisition Single-Shot Turbo Spin Echo) sequence.

8. A method as claimed in claim 1 comprising implementing said TSE-based reference scan to acquire said k-space data in said memory organized as k-space.

9. A magnetic resonance (MR) apparatus comprising:
   an MR data acquisition scanner;
   a control computer configured to generate control signals for execution of a simultaneous multi-slice (SMS) turbo spin echo (TSE) sequence in an MR data acquisition scanner that comprises control signals both for acquiring reference data and for acquiring raw MR data from a subject in a same SMS TSE scan;
   said computer being configured to provide said control signals from said computer to said MR data acquisition scanner and thereby operate said MR data acquisition scanner so as to execute said SMS TSE sequence in order to acquire said MR data simultaneously from multiple slices in said subject in an imaging scan of said SMS TSE scan, and enter said raw MR data as k-space data into a memory organized as k-space, said k-space data requiring said reference data in order to separate said k-space data into individual data sets respectively for said multiple slices;
   said computer being configured to also operate said MR data according to said SMS TSE sequence with said control signals, so as to acquire said reference data in a TSE-based reference scan of said SMS TSE scan;
   a reconstruction computer configured to separate the k-space data into said individual data sets for the respective multiple slices using said reference data, and to reconstruct a respective image of each of said multiple slices from the respective separated individual data sets; and said reconstruction computer being configured to make the respective data sets for the respective multiple slices available from the reconstruction computer in electronic form.

10. An MR apparatus as claimed in claim 9 wherein said computer is configured to operate said MR data acquisition scanner to implement said TSE-based reference scan before said imaging scan in said SMS TSE scan.

11. An MR apparatus as claimed in claim 9 wherein said computer is configured to operate said MR data acquisition scanner to implement said TSE-based reference scan after said imaging scan in said SMS TSE scan.

12. An MR apparatus as claimed in claim 11 wherein said imaging scan comprises a multi-band echo train for each SMS slice, and wherein said computer is configured to operate said MR data acquisition scanner to implement said reference scan after only one of said multi-band echo trains for the respective slices.

13. An MR apparatus as claimed in claim 12 wherein said computer is configured to operate said MR data acquisition scanner to implement said TSE-based reference scan after a last echo train in said imaging scan.

14. An MR apparatus as claimed in claim 9 wherein said computer is configured to operate said MR data acquisition scanner to implement said TSE-based reference scan as a RARE (Rapid Acquisition with Relaxation Enhancement) sequence.

15. An MR apparatus as claimed in claim 9 wherein said computer is configured to operate said MR data acquisition scanner to implement said TSE-based reference scan as a HASTE (Half-Fourier Acquisition Single-Shot Turbo Spin Echo) sequence.

16. An MR apparatus as claimed in claim 9 wherein said computer is configured to operate said MR data acquisition scanner to implement said TSE-based reference scan to acquire said k-space data in said memory organized as k-space.

* * * * *